(12) United States Patent
Matyushkin et al.

(10) Patent No.: US 9,275,887 B2
(45) Date of Patent: Mar. 1, 2016

(54) SUBSTRATE PROCESSING WITH RAPID TEMPERATURE GRADIENT CONTROL

(75) Inventors: Alexander Matyushkin, San Jose, CA (US); Dan Katz, Saratoga, CA (US); John Holland, San Jose, CA (US); Theodoros Panagopoulos, San Jose, CA (US); Michael D. Willwerth, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1129 days.

(21) Appl. No.: 11/778,019

(22) Filed: Jul. 14, 2007

(65) Prior Publication Data

US 2008/0017104 A1    Jan. 24, 2008

Related U.S. Application Data

(60) Provisional application No. 60/832,545, filed on Jul. 20, 2006.

(51) Int. Cl.
| | |
|---|---|
| *B05C 11/00* | (2006.01) |
| *H01L 21/683* | (2006.01) |
| *H01L 21/67* | (2006.01) |
| *B05C 13/00* | (2006.01) |

(52) U.S. Cl.
CPC ...... *H01L 21/6831* (2013.01); *H01L 21/67109* (2013.01); *H01L 21/67248* (2013.01); *B05C 13/00* (2013.01)

(58) Field of Classification Search
USPC ............... 361/234; 438/710; 165/104.26, 185
See application file for complete search history.

(56) References Cited

U.S. PATENT DOCUMENTS 3,123,086 A * 3/1964 Kleiss ............................ 137/4
4,645,218 A    2/1987 Ooshio et al.
(Continued)

FOREIGN PATENT DOCUMENTS

| EP | 0 123 456 A2 | 10/1984 |
|---|---|---|
| JP | 58-71626 | 4/1983 |

(Continued)

OTHER PUBLICATIONS

Roy, A.; Ghose, J.; Ray, A.; Ranganathan, R., Journal of Magnetism and Magnetic Materials 202 (1999) 359-364.*

(Continued)

*Primary Examiner* — Charles Capozzi
(74) *Attorney, Agent, or Firm* — Ashok K. Janah; Janah & Associates, PC

(57) ABSTRACT

A substrate processing chamber comprises an electrostatic chuck comprising a ceramic puck having a substrate receiving surface and an opposing backside surface. In one version, the ceramic puck comprises a thickness of less than 7 mm. An electrode is embedded in the ceramic puck to generate an electrostatic force to hold a substrate, and heater coils in the ceramic puck allow independent control of temperatures at different heating zones of the puck. A chiller provides coolant to coolant channels in a base below the ceramic puck. A controller comprises temperature control instruction sets which set the coolant temperature in the chiller in relation prior to ramping up or down of the power levels applied to the heater.

19 Claims, 8 Drawing Sheets

(56) References Cited

U.S. PATENT DOCUMENTS

| | | | |
|---|---|---|---|
| 4,909,314 A | 3/1990 | Lamont, Jr. | |
| 5,145,629 A | 9/1992 | Nilsson | |
| 5,155,652 A | 10/1992 | Logan et al. | |
| 5,191,506 A | 3/1993 | Logan et al. | |
| 5,228,501 A | 7/1993 | Tepman et al. | |
| 5,280,156 A | 1/1994 | Niori et al. | |
| 5,376,213 A | 12/1994 | Ueda et al. | |
| 5,460,684 A | 10/1995 | Saeki et al. | |
| 5,478,429 A | 12/1995 | Komino et al. | |
| 5,527,584 A | 6/1996 | Darfler et al. | |
| 5,529,657 A | 6/1996 | Ishii | |
| 5,561,348 A | 10/1996 | Schoenbach et al. | |
| 5,581,874 A | 12/1996 | Aoki et al. | |
| 5,600,530 A | 2/1997 | Smith | |
| 5,606,484 A | 2/1997 | Kawada et al. | |
| 5,625,526 A | 4/1997 | Watanabe et al. | |
| 5,665,260 A | 9/1997 | Kawada et al. | |
| 5,667,622 A | 9/1997 | Hasegawa et al. | |
| 5,671,116 A | 9/1997 | Husain | |
| 5,710,486 A | 1/1998 | Ye et al. | |
| 5,737,178 A | 4/1998 | Herchen | |
| 5,745,331 A | 4/1998 | Shamouilian et al. | |
| 5,818,693 A | 10/1998 | Garner et al. | |
| 5,827,585 A | 10/1998 | Giannetti | |
| 5,838,528 A | 11/1998 | Os et al. | |
| 5,858,100 A | 1/1999 | Maeda et al. | |
| 5,865,896 A | 2/1999 | Nowak et al. | |
| 5,886,863 A | 3/1999 | Nagasaki et al. | |
| 5,886,864 A | 3/1999 | Dvorsky | |
| 5,944,902 A | 8/1999 | Redeker et al. | |
| 5,949,650 A | 9/1999 | Bulante et al. | |
| 5,952,060 A | 9/1999 | Ravi | |
| 5,958,813 A | 9/1999 | Aida et al. | |
| 5,978,202 A | 11/1999 | Wadensweiler et al. | |
| 5,986,747 A | 11/1999 | Moran | |
| 6,035,101 A * | 3/2000 | Sajoto et al. | 392/416 |
| 6,043,110 A * | 3/2000 | Davis et al. | 438/118 |
| 6,048,434 A * | 4/2000 | Tamura et al. | 156/345.52 |
| 6,072,685 A | 6/2000 | Herchen et al. | |
| 6,073,577 A * | 6/2000 | Lilleland et al. | 118/723 E |
| 6,094,334 A | 7/2000 | Bedi et al. | |
| 6,108,190 A | 8/2000 | Nagasaki | |
| 6,129,046 A | 10/2000 | Mizuno et al. | |
| 6,220,201 B1 | 4/2001 | Nowak et al. | |
| 6,256,187 B1 | 7/2001 | Matsunaga et al. | |
| 6,310,755 B1 | 10/2001 | Kholodenko et al. | |
| 6,320,736 B1 * | 11/2001 | Shamouilian et al. | 361/234 |
| 6,361,644 B1 | 3/2002 | Collins | |
| 6,394,797 B1 * | 5/2002 | Sugaya et al. | 432/253 |
| 6,436,267 B1 | 8/2002 | Carl et al. | |
| 6,440,221 B2 | 8/2002 | Shamouilian et al. | |
| 6,465,051 B1 | 10/2002 | Sahin et al. | |
| 6,469,283 B1 * | 10/2002 | Burkhart et al. | 219/486 |
| 6,490,144 B1 * | 12/2002 | Narendrnath et al. | 361/234 |
| 6,506,291 B2 | 1/2003 | Tsai et al. | |
| 6,524,432 B1 | 2/2003 | Collins et al. | |
| 6,535,372 B2 | 3/2003 | Parkhe et al. | |
| 6,538,872 B1 | 3/2003 | Wang et al. | |
| 6,563,686 B2 | 5/2003 | Tsai et al. | |
| 6,572,732 B2 | 6/2003 | Collins | |
| 6,579,730 B2 | 6/2003 | Li et al. | |
| 6,586,886 B1 | 7/2003 | Katz et al. | |
| 6,607,640 B2 | 8/2003 | Sundarrajan et al. | |
| 6,623,596 B1 | 9/2003 | Collins et al. | |
| 6,652,713 B2 | 11/2003 | Brown et al. | |
| 6,664,738 B2 | 12/2003 | Arai et al. | |
| 6,693,030 B1 | 2/2004 | Subrahmanyan et al. | |
| 6,705,394 B1 * | 3/2004 | Moslehi et al. | 165/206 |
| 6,793,767 B2 | 9/2004 | Chu et al. | |
| 6,810,298 B2 * | 10/2004 | Emoto | 700/121 |
| 6,831,307 B2 * | 12/2004 | Fujii | 257/180 |
| 6,853,533 B2 | 2/2005 | Parkhe | |
| 6,863,020 B2 | 3/2005 | Mitrovic et al. | |
| 6,916,399 B1 | 7/2005 | Rozenzon et al. | |
| 6,936,343 B1 * | 8/2005 | Hiramatsu et al. | 428/314.8 |
| 7,028,763 B2 | 4/2006 | Holland et al. | |
| 7,085,616 B2 | 8/2006 | Chin et al. | |
| 7,170,142 B2 | 1/2007 | Wojcik et al. | |
| 7,196,283 B2 | 3/2007 | Buchberger et al. | |
| 7,221,553 B2 | 5/2007 | Nguyen et al. | |
| 7,436,645 B2 | 10/2008 | Holland et al. | |
| 2001/0017205 A1 | 8/2001 | Ikeda | |
| 2001/0025783 A1 | 10/2001 | Sundarrajan et al. | |
| 2001/0052359 A1 | 12/2001 | Ikeda | |
| 2002/0021545 A1 | 2/2002 | Tatsumi et al. | |
| 2002/0050246 A1 | 5/2002 | Parkhe | |
| 2002/0113056 A1 | 8/2002 | Sugaya et al. | |
| 2002/0157611 A1 | 10/2002 | Bondestam et al. | |
| 2002/0170882 A1 | 11/2002 | Akiba | |
| 2002/0185487 A1 * | 12/2002 | Divakar et al. | 219/444.1 |
| 2003/0019426 A1 * | 1/2003 | Inoue et al. | 118/429 |
| 2003/0029569 A1 * | 2/2003 | Natsuhara et al. | 156/345.51 |
| 2003/0155079 A1 | 8/2003 | Bailey et al. | |
| 2003/0164226 A1 | 9/2003 | Kanno et al. | |
| 2003/0215962 A1 | 11/2003 | Hausmann et al. | |
| 2003/0230551 A1 | 12/2003 | Kagoshima et al. | |
| 2004/0061449 A1 | 4/2004 | Arai et al. | |
| 2004/0185670 A1 | 9/2004 | Hamelin et al. | |
| 2004/0187787 A1 | 9/2004 | Dawson et al. | |
| 2004/0195216 A1 | 10/2004 | Strang | |
| 2004/0200498 A1 | 10/2004 | Wang et al. | |
| 2004/0212947 A1 * | 10/2004 | Nguyen et al. | 361/234 |
| 2004/0255868 A1 * | 12/2004 | AmRhein et al. | 118/728 |
| 2004/0261721 A1 | 12/2004 | Steger | |
| 2005/0000937 A1 | 1/2005 | Chiang et al. | |
| 2005/0036268 A1 * | 2/2005 | Howald et al. | 361/234 |
| 2005/0042881 A1 * | 2/2005 | Nishimoto et al. | 438/710 |
| 2005/0118450 A1 * | 6/2005 | Fujii et al. | 428/621 |
| 2005/0173410 A1 | 8/2005 | Okajima et al. | |
| 2005/0183669 A1 | 8/2005 | Parkhe et al. | |
| 2005/0229854 A1 | 10/2005 | Moroz | |
| 2005/0230047 A1 | 10/2005 | Collins et al. | |
| 2006/0023395 A1 | 2/2006 | Hsiao et al. | |
| 2006/0076108 A1 | 4/2006 | Holland et al. | |
| 2006/0076109 A1 * | 4/2006 | Holland et al. | 156/345.27 |
| 2006/0137607 A1 | 6/2006 | Seo et al. | |
| 2006/0158821 A1 | 7/2006 | Miyashita | |
| 2006/0219360 A1 | 10/2006 | Iwasaki | |
| 2006/0274298 A1 | 12/2006 | Akaike | |
| 2007/0040041 A1 | 2/2007 | Le et al. | |
| 2007/0081294 A1 | 4/2007 | Buchberger et al. | |
| 2007/0081296 A1 | 4/2007 | Brillhart et al. | |
| 2007/0091537 A1 | 4/2007 | Buchberger et al. | |
| 2007/0102118 A1 | 5/2007 | Holland et al. | |
| 2007/0139856 A1 | 6/2007 | Holland et al. | |
| 2007/0251456 A1 | 11/2007 | Herchen et al. | |
| 2007/0256785 A1 | 11/2007 | Pamarthy et al. | |
| 2007/0256786 A1 | 11/2007 | Zhou et al. | |
| 2007/0258186 A1 | 11/2007 | Matyushkin et al. | |
| 2008/0142208 A1 | 6/2008 | Ranish et al. | |
| 2008/0276958 A1 | 11/2008 | Mehta et al. | |

FOREIGN PATENT DOCUMENTS

| | | |
|---|---|---|
| JP | 4-238882 | 8/1992 |
| JP | 9-17770 A | 1/1997 |
| JP | 9-45757 | 2/1997 |
| JP | 09045757 | 2/1997 |
| JP | 10-209257 | 8/1998 |
| JP | 10-270540 | 10/1998 |
| JP | 10270540 | 10/1998 |
| JP | 11-163109 | 6/1999 |
| JP | 11163109 | 6/1999 |
| JP | 11-176919 | 7/1999 |
| JP | 11176919 | 7/1999 |
| JP | 11-297806 A | 10/1999 |
| JP | 2001-118915 A | 4/2001 |
| JP | 2002-519863 A | 7/2002 |

(56) References Cited

FOREIGN PATENT DOCUMENTS

| | | |
|---|---|---|
| JP | 2003-7432 A | 1/2003 |
| JP | 2003-077783 A | 3/2003 |
| JP | 2003-249541 A | 9/2003 |
| JP | 2004-179364 A | 6/2004 |
| JP | 2005-191561 A | 7/2005 |
| JP | 2005-268654 A | 9/2005 |
| JP | 2006-13256 A | 1/2006 |
| JP | 2006-140455 A | 6/2006 |
| TW | 503484 A | 9/2002 |
| TW | I323018 A | 5/2006 |
| WO | WO-02/17384 A1 | 2/2002 |
| WO | WO-02/082511 A2 | 10/2002 |
| WO | WO-2008/140982 | 11/2008 |

OTHER PUBLICATIONS

Kropewnicki et al., "Temperature dependence of the sticking coefficient of etch by-products . . . ", U.S. Appl. No. 60/658,698, filed Mar. 3, 2005.

Matyushkin et al., "Substrate support with electrostatic chuck having dual temperature zones", U.S. Appl. No. 60/796,013, filed Apr. 27, 2006.

Waits, R.K. "Monitoring residual and process gases in PVD processes: The importance of sen . . . ", Micromagazine, Jun. 1997, http://www.micromagazine.com/archive/97/06/waits.html.

IBM Technical Disclosure Bulletin, vol. 31, No. 1, Jun. 1988, pp. 462-464.

\* cited by examiner

SUBSTRATE PROCESSING WITH RAPID TEMPERATURE GRADIENT CONTROL

CROSS-REFERENCE TO RELATED APPLICATION

This application claims priority to U.S. Provisional Application Ser. No. 60/832,545, filed Jul. 20, 2006, which is incorporated herein by reference.

BACKGROUND

Embodiments of the present invention relate to processing of a substrate with rapid temperature gradient control across the substrate. In the processing of substrates, such as semiconductors and displays, an electrostatic chuck is used to hold a substrate in a chamber for processing of a layer on the substrate. A typical electrostatic chuck comprises an electrode covered by a ceramic. When the electrode is electrically charged, electrostatic charges accumulate in the electrode and substrate, and the resultant electrostatic force holds the substrate to the chuck. Typically, the temperature of the substrate is controlled by maintaining helium gas behind the substrate to enhance heat transfer rates across the microscopic gaps at the interface between the back of the substrate and the surface of the chuck. The electrostatic chuck can be supported by a base which has channels for passing a fluid therethrough to cool or heat the chuck. Once a substrate is securely held on the chuck, process gas is introduced into the chamber and a plasma is formed to process the substrate. The substrate can be processed by a CVD, PVD, etch, implant, oxidation, nitridation, or other such processes.

In such conventional substrate fabrication processes, the substrate is maintained at a single temperature during processing. Typically, the substrate is passed through a slit in the chamber by a wafer blade and deposited on lift pins which are extended through the body of the electrostatic chuck. The lift pins are then retracted back through the chuck to deposit the substrate on the surface of the chuck. The substrate quickly rises in temperature to a preset temperature which is then maintained steady by heaters in the chuck or by the plasma formed in the chamber. The substrate temperature can be further controlled by the temperature and flow rate of coolant passed through the channels of the base and below the chuck which is used to remove heat from the chuck.

While conventional processing chamber are suitable for maintaining the substrate at a steady single temperature during processing, they do not allow rapid changing of the temperature of the substrate during a single process cycle. In certain processes, it is desirable to rapidly ramp up or down the substrate temperature, to achieve a particular temperature profile during the process. For example, it can be desirable to have rapid changes in substrate temperature at different stages of an etching process to allow etching of different materials on the substrate at different substrate temperatures. At these different etching stages, the process gas provided to the chamber can also change in composition or have the same composition. As another example, in etching processes, such a temperature profile may be useful to deposit sidewall polymer on the sidewalls of the features being etched on the substrate, and later in the same etching process, remove the sidewall polymer by increasing the temperature of the etching process, or vice versa. Similarly, in deposition processes, it may be desirable to have a first processing temperature which is higher or lower than a second processing temperature, for example, to initially deposit a nucleating layer on the substrate and then grow a thermally deposited layer on the substrate. Conventional substrate processing chambers and their internal components often do not allow sufficiently rapid ramp up and down of substrate temperatures.

A further complication arises when, during processing, the substrate is subjected to non-uniform process conditions in a radial direction across the substrate which give rise to non-uniform concentric processing bands. The non-uniform processing conditions can arise from the distribution of gas or plasma species in the chamber, which often varies depending on the location of the inlet and exhaust gas ports in the chamber. Mass transport mechanisms can also alter the rate of arrival or dissipation of gaseous species at different regions of the substrate surface. Non-uniform processing can also occur as a result of non-uniform heat loads in the chamber, arising for example, from the non-uniform coupling of energy from a plasma sheath to the substrate or from radiant heat reflected from chamber walls. The processing bands and other variations across the substrate are undesirable as the electronic devices being fabricated at different regions of the substrate, for example, the peripheral and central substrate regions, end up with different properties. Accordingly, it is desirable to reduce the variations in processing rates and other process characteristics across the substrate surface during processing of the substrate.

Thus it is desirable to have a process chamber and components that allow rapid temperature ramp up and down of the substrate being processed in the chamber. It is further desirable to control temperatures at different regions across the processing surface of the substrate to reduce the effect of non-uniform processing conditions across the substrate surface in the radial direction. It can also be desirable to control the temperature profile across the substrate during processing.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
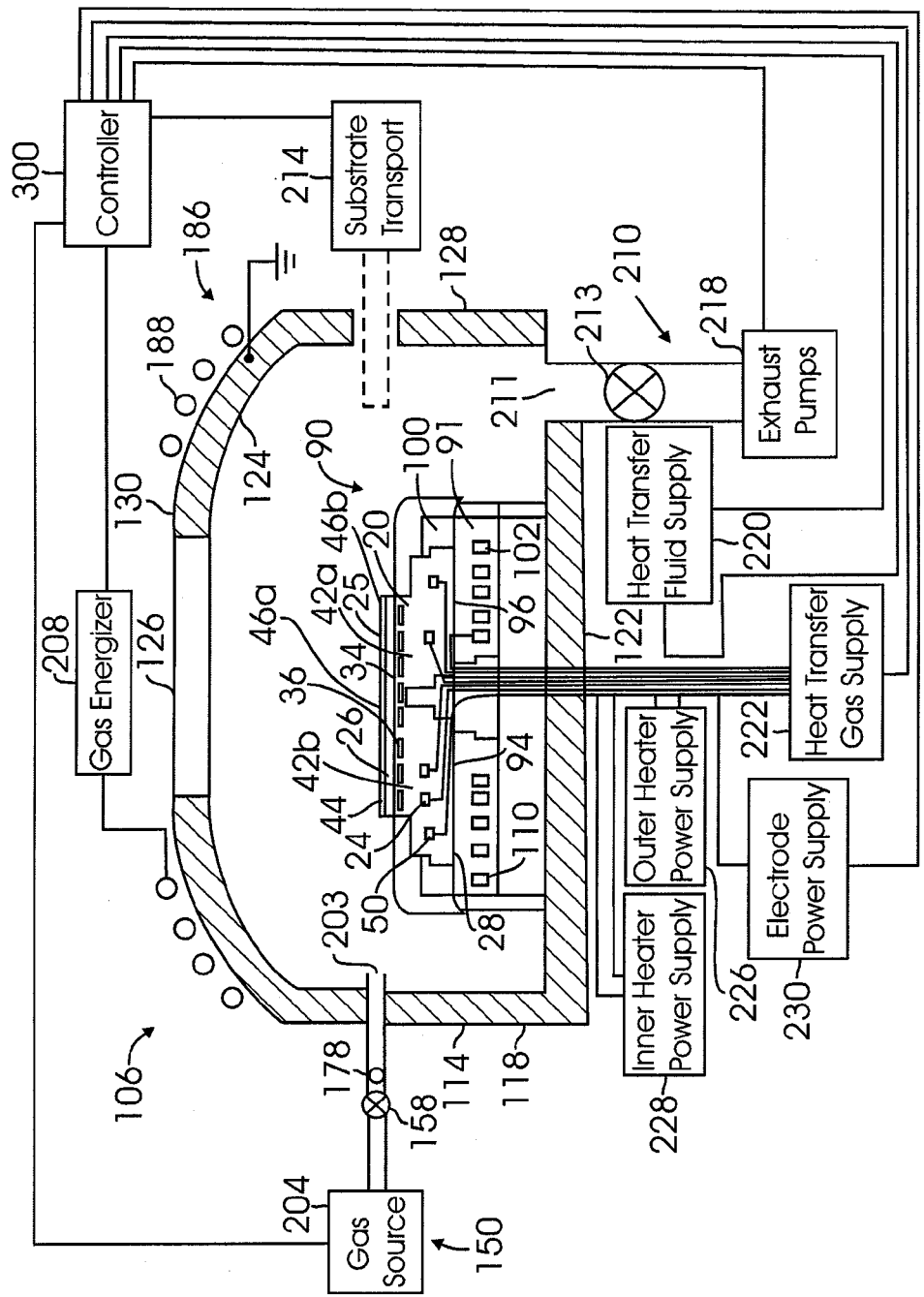
FIG. 1 is a schematic side view of an embodiment of a substrate processing chamber with the electrostatic chuck.

An exemplary version of a chamber 106 capable of etching a substrate 25 is schematically illustrated in FIG. 1. The chamber 106 is representative of a Decoupled Plasma Source (DPS™) chamber which is an inductively coupled plasma etch chamber available from Applied Materials Inc., Santa Clara, Calif. The DPS chamber 106 may be used in the CENTURA® Integrated Processing System, commercially available from Applied Materials, Inc., Santa Clara, Calif. However, other process chambers may also be used in conjunction with the present invention, including, for example, capacitively coupled parallel plate chambers, magnetically enhanced ion etch chambers, inductively coupled plasma etch chambers of different designs, as well as deposition chambers. Although the present apparatus and processes are advantageously used in a DPS chamber, the chamber is provided only to illustrate the invention, and should not be construed or interpreted to limit the scope of the present invention.

Referring to FIG. 1, a typical chamber 106 comprises a housing 114 comprising enclosure walls 118 that include sidewalls 128, a bottom wall 122, and a ceiling 130. The ceiling 130 may comprise a flat shape as shown, or a dome shape with a multi-radius arcuate profile as, for example, described in U.S. Pat. No. 7,074,723, to Chinn et al., entitled "Method of Plasma Etching a Deeply Recessed Feature in a Substrate Using a Plasma Source Gas Modulated Etchant System", which is incorporated by reference herein in its entirety. The walls 118 are typically fabricated from a metal, such as aluminum, or ceramic materials. The ceiling 130 and/or sidewalls 128 can also have a radiation permeable window 126 which allows radiation to pass through the chamber to monitor processes being conducted in the chamber 106. A plasma is formed in a process zone defined by the process chamber 106, the substrate support and the domed ceiling 130.

Figure 2:
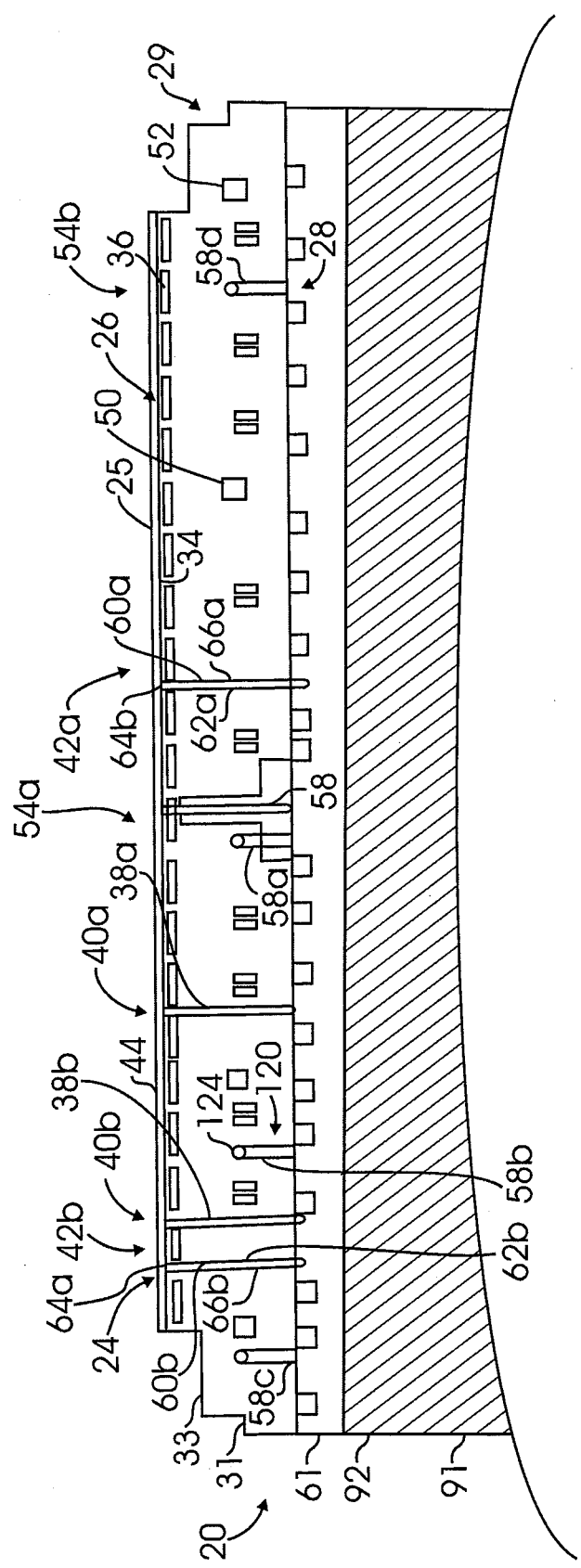
FIG. 2 is a schematic sectional side view of an embodiment of an electrostatic chuck.

The substrate 25 is held in the chamber 106 on a receiving surface 26 of a substrate support comprising an electrostatic chuck 20 which in turn rests on a base 91. The electrostatic chuck 20 comprises a ceramic puck 24 having a substrate receiving surface 26 which is the top surface of the puck 24, and serves to hold a substrate 25, as shown in FIGS. 1 and 2. The ceramic puck 24 also has a backside surface 28 opposing the substrate receiving surface 26. The ceramic puck 24 has a peripheral ledge 29 having a first step 31 and a second step 33. The ceramic puck 24 comprises at least one of aluminum oxide, aluminum nitride, silicon oxide, silicon carbide, silicon nitride, titanium oxide, zirconium oxide, and mixtures thereof. The ceramic puck 24 can be unitary monolith of ceramic made by hot pressing and sintering a ceramic powder, and then machining the sintered form to form the final shape of the chuck 20.

It was determined that the thickness of the ceramic puck 24 substantially affects the ability to rapidly ramp up and ramp down the temperature of the substrate. If the ceramic puck 24 is too thick, the puck 24 takes too long to ramp up and down in temperature, causing the temperature of the overlying substrate to take a correspondingly excessive time to reach the desired set point temperature. Further, it was also determined that if the ceramic puck 24 is too thin, it does not maintain the substrate at a steady state temperature and results in substrate temperature fluctuations during processing. Also, the thickness of the ceramic puck 24 affects operation of the electrode 36 which is embedded in the ceramic puck 24. If the thickness of the layer of the ceramic puck 24 directly above the embedded electrode 36 is too high, the electrode 36 does not effectively couple energy to the plasma formed in the process zone. On the other hand, if the thickness of ceramic puck 24 about the electrode 36 is too thin, the RF voltage applied to the electrode 36 can discharge into the plasma creating arcing and plasma instabilities. Thus, the thickness of the ceramic puck 24 was precisely controlled to be a thickness of less than about 7 mm, for example, a thickness of from about 4 to about 7 mm; and in one version, the ceramic puck had a thickness of 5 mm. At these thickness levels, the ceramic puck 24 allowed rapid increase and decrease in the substrate temperature while reducing temperature fluctuations during the process, and substantially without creating plasma instabilities.

The electrode 36 embedded in the ceramic puck 24 is used to generate an electrostatic force to retain a substrate placed on the substrate receiving surface 26, and optionally, to capacitively couple energy to the plasma formed in the chamber 106. The electrode 36 is a conductor, such as a metal, and be shaped as a monopolar or bipolar electrode. Monopolar electrodes comprise a single conductor and have a single electrical connection to an external electrical power source and cooperate with the charged species of the overlying plasma formed in a chamber to apply an electrical bias across the substrate held on the chuck 20. Bipolar electrodes have two or more conductors, each of which is biased relative to the other to generate an electrostatic force to hold a substrate. The electrode 36 can be shaped as a wire mesh or a metal plate with suitable cut-out regions. For example, an electrode 36 comprising a monopolar electrode can be a single continuous wire mesh embedded in the ceramic puck as shown. An embodiment of an electrode 36 comprising a bipolar electrode can be a pair of filled-in C-shaped plates that face one another across the straight leg of the C-shape. The electrode 36 can be composed of aluminum, copper, iron, molybdenum, titanium, tungsten, or alloys thereof. One version of the electrode 36 comprises a mesh of molybdenum. The electrode 36 is connected to a terminal post 58 which supplies electrical power to the electrode 36 from an external power supply 230, which can include a DC voltage power supply, and optionally, an RF voltage power supply.

Optionally, a plurality of heat transfer gas conduits 38$a,b$ traverse the ceramic puck 24 and terminate in ports 40$a,b$ on the substrate receiving surface 26 of the chuck 20 to provide heat transfer gas to the substrate receiving surface 26. The heat transfer gas, which can be for example, helium, is supplied below the substrate backside 34 to conduct heat away from the overlying substrate 25 and to the receiving surface 26 of the ceramic puck 24. For example, a first gas conduit 38$a$ can be located to supply heat transfer gas to a central heating zone 42$a$ of the substrate receiving surface 26, and a second gas conduit 38$b$ can be located to supply heat transfer gas to a peripheral heating zone 42$b$ of the substrate receiving surface 26. The central and peripheral heating zones 42$a,b$ of the substrate receiving surface 26 of the ceramic puck 24 allow corresponding portions of the substrate surface 44, for example, the overlying central and peripheral portions 46$a,b$ of the substrate 25 to be maintained at different temperatures to compensate for non-uniform concentric processing bands that would otherwise occur in the substrate 25 due to corresponding non-uniform bands of process conditions which are different from one another.

Figure 8:
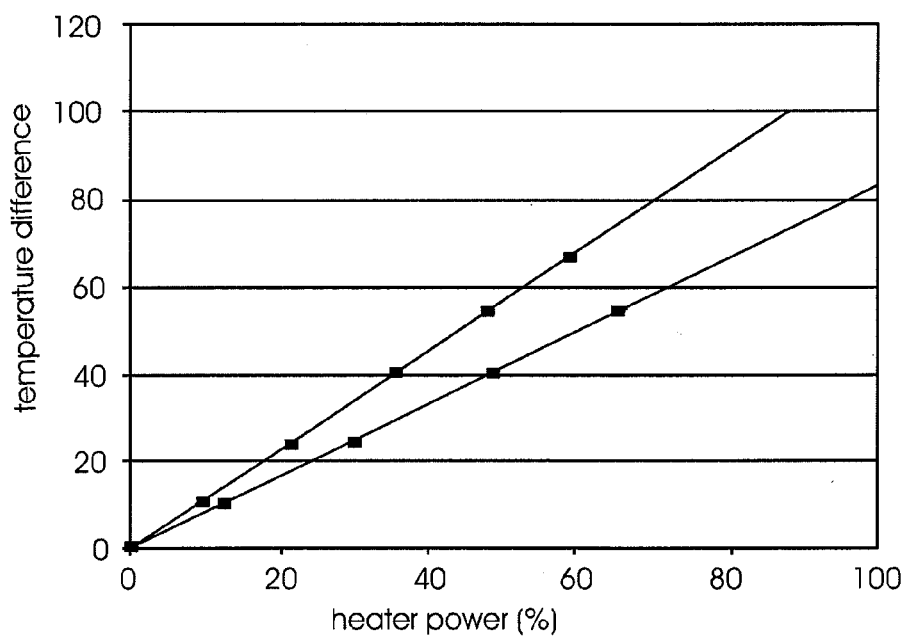
FIG. 8 is a graph depicting the temperature difference between the electrostatic chuck and the chiller versus the percentage of heater power.

The ceramic puck 24 also has an embedded heater to heat the substrate 25. The heater comprises a plurality of heater coils 50, 52, for example, a first heater coil 50 and a second heater coil 52, embedded in the ceramic puck 24. The temperatures at the central and peripheral heating zones 42$a,b$ of the substrate receiving surface 26 of the ceramic puck 24 are controlled using heater coils 50, 52 which are radially spaced apart and concentric about one another. In one version, the first heater coil 50 is located at a peripheral portion 54b of the ceramic puck 24 and the second heater coil 52 located at a central portion 54a of the ceramic puck 24. The first and second heater coils 50, 52 allow independent control of the temperatures of the central and peripheral portions 54a, 54b of the ceramic puck 24, providing the ability to independently control the temperatures of the heating zones 42a,b, to achieve different processing rates or characteristics across the radial direction of the processing surface 44 of the substrate 25. As such, different temperatures can be maintained at the two heating zones 42a,b to affect the temperatures of the overlying central and peripheral portions 46a,b of the substrate 25, thereby counteracting any variable gas species distribution or heat load occurring during processing of the substrate 25. For example, when gas species at the peripheral portion 46b of the processing surface 44 of the substrate 25 are less active than those at the central portion 46b, the temperature of the peripheral heating zone 42b is elevated to a higher temperature than the central heating zone 42a to provide a more uniform processing rates or process characteristics across the processing surface 44 of the substrate 25. FIG. 8 demonstrates how the change in the substrate temperature is dependent upon the percentage of heater power supplied by the inner and outer heating coils embedded in the chuck 20.

In one version, the first and second heater coils 50, 52 each comprise circular loops of resistive heating elements that are arranged side by side, and can even be substantially in the same plane. For example, the heater coils 50, 52 can each be a continuous concentric loop that gradually spirals radially inward in the body of the ceramic puck 24. In one version, the heater comprises a coil having first loops spaced apart a first distance and second loops spaced apart a second distance that is greater than the first distance. The second loops are positioned about a lift pin hole in the puck. The heater coils 50, 52 can also be spiral coils that spiral about an axis passing through the center of the coils, for example, like a light bulb filament, which are positioned in concentric circles across the inside volume of the ceramic puck 24. The resistive heating elements can be composed of different electrically resistive materials, such as for example, tungsten or molybdenum.

The heater coils 50, 52 have an electrical resistance and operating power level that is selected to enhance the rate of ramping up and down the temperature of the substrate 25. In one version, the heater coils 50, 52 each comprise an electrical resistance sufficiently high to rapidly rise to and maintain the substrate receiving surface 26 of the ceramic puck 24 at temperatures of from about 80 to about 250° C. In this version, the electrical resistance of the coils are from about 4 to about 12 Ohms. In one example, the first heater coil 50 has an electrical resistance of 6.5 ohm and the second heater coil 52 has an electrical resistance inner of 8.5 ohm. In another version, the first and second heater coils comprise a total resistance of less than 10 ohms. In one version, the heater comprises a resistance of 8.5 ohms. The heater coils 50, 52 are powered via independent terminal posts 58a-d which extend through the ceramic puck 24.

In conjunction with the heater coils 50, 52, the pressure of heat transfer gas can also be controlled in the two heating zones 42a,b to render the substrate processing rates more uniform across the substrate 25. For example, the two zones 42a,b can each be set to hold heat transfer gas at a different equilibrated pressure to provide different heat transfer rates from the backside 34 of the substrate 25. This is accomplished by supplying heat transfer gas at two different pressures through the two conduits 38a, 38b, respectively, to exit at two different locations of the substrate receiving surface 26.

Figure 3:
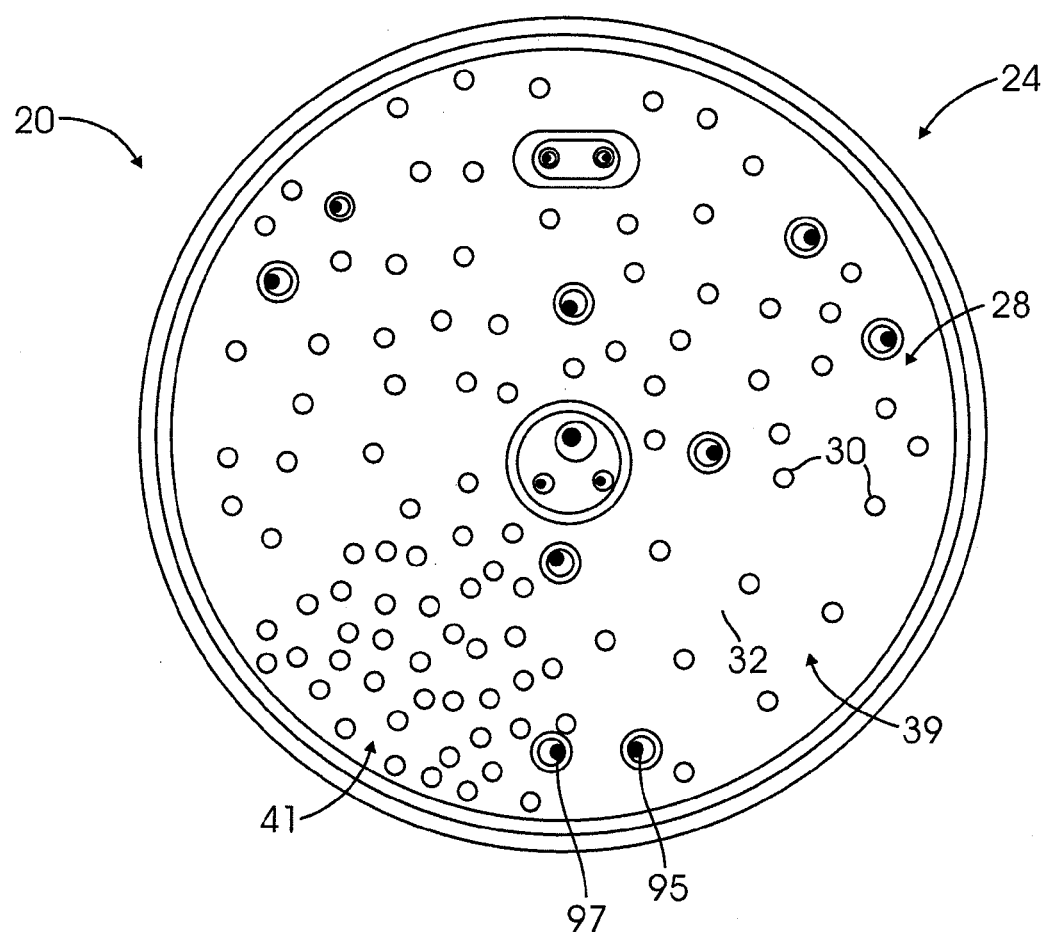
FIG. 3 is a schematic bottom view of the electrostatic chuck of FIG. 1.

The backside surface 28 of the ceramic puck 24 can have a plurality of spaced apart mesas 30 as shown in FIG. 3. In one version, the mesas 30 are cylindrical mounds that are separated from each other by a plurality of gaps 32. In use, the gaps 32 are filled with a gas, such as air, to regulate the heat transfer rates from the backside surface 28 to the underlying surface of the base. In one embodiment, the mesas 30 comprise cylindrical mounds, which can even be shaped as posts, that extend up from the surface 28, the posts having a rectangular or circular cross-sectional shape. The height of the mesas 30 can be from about 10 to about 50 microns, and the diameter of the mesas 30 can be from about 500 to about 5000 microns. However, the mesas 30 can also have other shapes and sizes, for example, cones or rectangular blocks, or even bumps of varying sizes. In one version, the mesas 30 are formed by bead blasting the backside surface 28 with a bead size that is suitably small, for example, in the tens of microns, to etch away by erosion the material of the backside surface 28 to form the shaped mesas 30 with the intervening gaps 32.

The electrostatic chuck 20 also includes an optical temperature sensor 60a,b that passes through holes 62a,b in the ceramic puck 24 to contact and accurately measure the temperatures of the overlying central and peripheral portions 46a,b of the substrate 25. A first sensor 60a is positioned at the central heating zone 42a of the ceramic puck 24 to read the temperature of the central portion 46a of the substrate 25, and a second sensor 60b is positioned at the peripheral heating zone 42b of the ceramic puck 24 to correspondingly read the temperature at the peripheral portion 46b of the substrate 25. The optical temperature sensors 60a,b are positioned in the chuck 20 so that the tips 64a,b of the sensors lies in a plane with the substrate receiving surface 26 of the ceramic puck 24, such that the sensor tips 64a,b can contact the backside 34 of the substrate 25 held on the chuck 20. The legs 66a,b of the sensors 60a,b extend vertically through the body of the ceramic puck 24.

Figure 5:
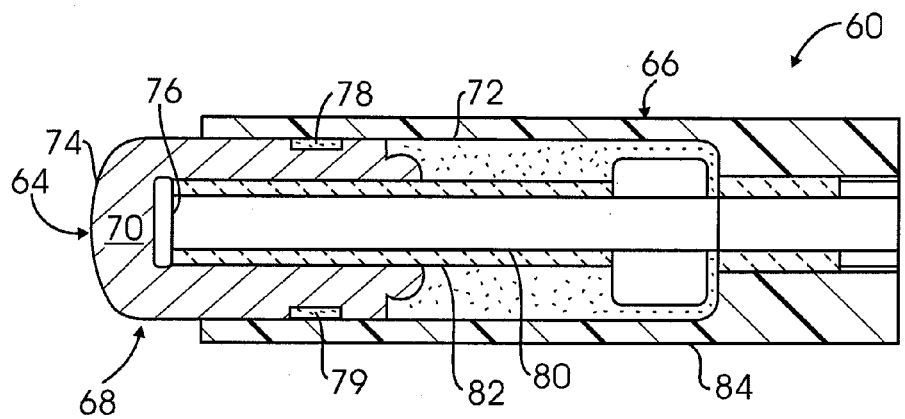
FIG. 5 is a schematic side view of an optical temperature sensor.

In one version, as shown in FIG. 5, each optical temperature sensor 60 comprises a heat sensor probe 68 comprising a copper cap 70 shaped as a close off cylinder with a side 72 and a dome-shaped top 74 that serves as the tip 64. The copper cap 70 can be composed of oxygen free copper material. A phosphorous plug 76 is embedded inside, and in direct contact with, the top 74 of the copper cap 70. The phosphorous plug 76 embedded in the copper cap 70 provides quicker and more sensitive thermal response for the heat sensing probe 68. The tip 64 of the copper cap 70 is a dome-shaped top 74 to allow repeated contact with different substrates 25 without eroding or damaging the substrates. The copper cap 70 has a recessed groove 78 for receiving epoxy 79 to affix the cap 70 in the sensor probe 68.

The phosphorous plug 76 converts heat in the form of infrared radiation to photons which are passed though an optical fiber bundle 80. The optical fiber bundle 80 can be composed of borosilicate glass fibers. The optical fiber bundle 80 is encased by a sleeve 82, which in turn is partially surrounded by a temperature isolation jacket 84 that serves to isolate the temperature sensor from the heat of the base that supports the ceramic puck. The sleeve 82 can be a glass tubing to provide better thermal insulation from the surrounding structure, but can also be made from a metal such as copper. The temperature isolation jacket 84 may be composed of PEEK, a polyetheretherketone, and can also be Teflon® (polytetrafluoroethylene) from Dupont de Nemours Co. Delaware.

Figure 4A:
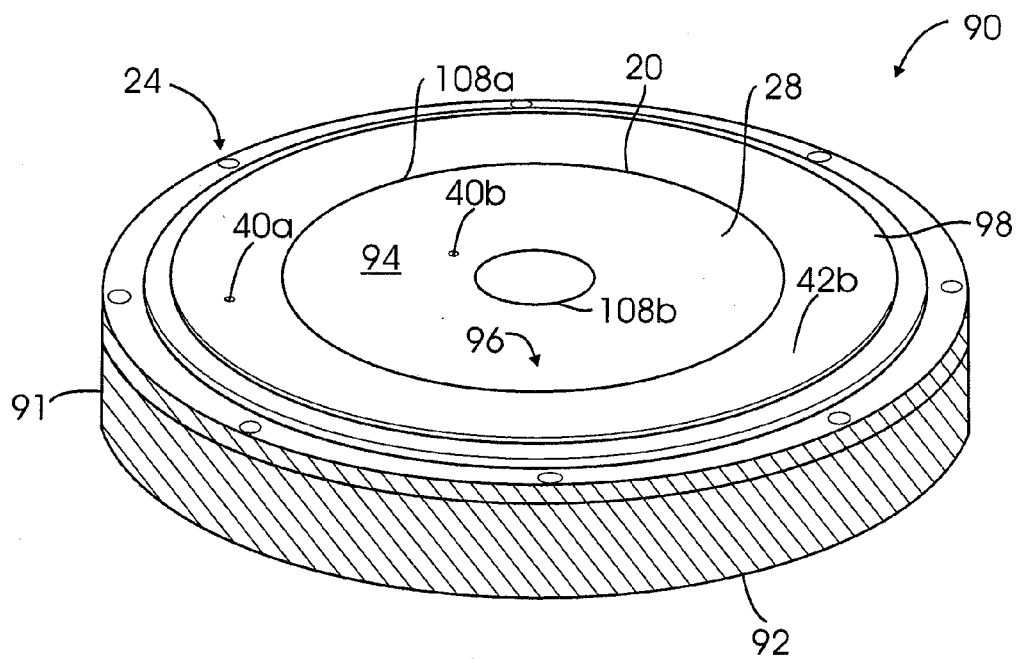
FIGS. 4A and 4B are schematic perspective views of the top (FIG. 4A) and bottom (FIG. 4B) of an embodiment of a base for the electrostatic chuck.
Figure 4B:
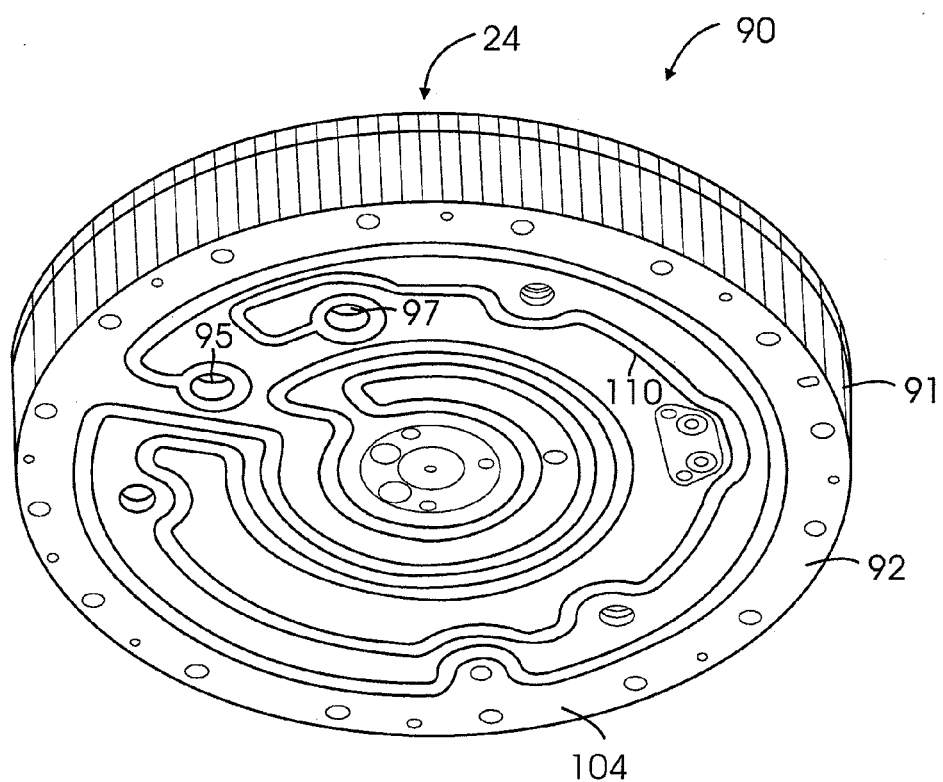

A substrate support 90 comprising the electrostatic chuck 20 is secured to a coolant base 91 which is used to support and secure the chuck 20, as well as to cool the chuck (FIGS. 4A and 4B). The base 91 comprises a metal body 92 with a top surface 94 having a chuck receiving portion 96 and peripheral portion 98. The chuck receiving portion 96 of the top surface 94 is adapted to receive the backside surface 28 of the ceramic puck 24 of the electrostatic chuck 20. The peripheral portion 98 of the base 91 extends radially outward beyond the ceramic puck 24. The peripheral portion 98 of the base 91 can be adapted to receive a clamp ring 100 which can be secured to the top surface of the peripheral portion of the base. The metal body 92 of the base 91 has a number of passages 102 running from a bottom surface 104 of the base 91 to the top surface 94 of the base 91, to for example, hold the terminals 58a-d or feed gas to the gas conduits 38a,b of the ceramic puck 24.

The base 91 has a coolant channel 110 comprising an inlet 95 and a terminus 97 to circulate coolant through the channel. The inlet 95 and terminus 97 of the coolant channel 110 can be positioned adjacent to one another when the coolant channel 110 loops back upon itself, as shown in FIG. 4B. The coolant may be fluid, such as water, or other suitable heat transfer fluid, which is maintained at a preset temperature in any chiller, and pumped through the channel of the base 91. The base 91 with the circulating cooling fluid serves as a heat exchanger to control the temperatures of the chuck 20 to achieve desired temperatures across the processing surface 44 of the substrate 25. The fluid passed through the channels 110 can be heated or cooled to raise or lower the temperature of the chuck 20 and that of the substrate 25 held on the chuck 20. In one version, the channels 110 are shaped and sized to allow fluid to flow through to maintain the base 91 at temperatures of from about 0 to 120° C.

The chuck receiving portion 96 of the top surface 94 of the base 91 comprises one or more grooves 108a,b to retain and flow air across the backside of the ceramic puck 24. In one embodiment, the chuck receiving portion 96 comprises a peripheral groove 108a which cooperates with a plurality of mesas 30 on the backside surface 28 of a ceramic puck 24 to control a rate of heat transfer from the peripheral portion 54b of the ceramic puck 24. In another embodiment, the chuck receiving surface of the base comprises a peripheral groove to contain air about the mesas of the backside of the puck. In yet another embodiment, a central groove 108b is used in conjunction with the peripheral groove 108a to regulate heat transfer from the central portion 54a of the ceramic puck 24.

The grooves 108a,b in the top surface 94 of the base 91 cooperate with the mesas 30 on the backside surface 28 of the ceramic puck 24 to further regulate the temperatures across the substrate processing surface 44. The mesas 30 on the backside surface 28 of the ceramic puck 24 can be distributed across the backside surface 28 in a uniform or non-uniform pattern. The shape, size, and spacing of the mesas 30 control the total amount of contact surface of the mesas 30 with the top surface 94 of the base 91 thereby controlling the total heat conduction area of the interface. When in a uniformly spaced apart pattern, the distance between the mesas 30 as represented by the gaps 32 remain substantially the same, and in a non-uniform spacing, the gap distance varies across the surface 28.

Optionally, the backside surface 28 of the ceramic puck 24 can have a first array 39 of mesas 30 adjacent to the inlet of the coolant channel 111 in the base, and a second array 41 of the mesas 30 distal from the inlet 95 of the channel 111 or even adjacent to the terminus 97 of the coolant channel 111, as shown in FIG. 3. The second array 41 of mesas 30 has a different gap distance forming a different pattern than the first array 39 to regulate the heat transfer rates about the regions adjacent to, and distal from the coolant channel 111. For example, a portion of the ceramic puck 24 overlying a segment of the coolant channel 111 near the channel inlet 95 which receives fresh coolant is often maintained at lower temperatures that the portion of the ceramic puck 24 overlying a segment of the coolant channel 111 near the channel terminus. This is because the coolant warms up as it travels through the length of the channel in the base by capturing heat from the ceramic puck 24. As result, the substrate 25 placed on the receiving surface 26 of the ceramic puck 24 has a temperature profile with higher temperatures and regions overlying the coolant channel terminus 97 relative to the temperatures of regions overlying the inlet 95. This temperature profile is compensated for by providing a first array 39 of mesas 30 about the channel inlet which are spaced apart at a first gap distance, and a second array 41 of mesas 30 about the channel 111 terminus 97 which are spaced apart at a second gap distance which is different from the first distance. When the first distance is larger than the second distance, the heat transfer rate from the portions of the substrate 25 directly overlying the first array 39 is lower than the heat transfer rate from portions of the substrate 25 directly overlying the second array 41. Consequently, heat is transferred away at a slower rate from the first substrate regions than the rate of heat transfer from the second substrate regions causing the first regions to become warmer than the second regions to compensate for and equalize the temperature profile that would otherwise have occurred across the substrate surface 44 of the coolant channel inlet 95 and terminus 97. In one example, the first array 39 of mesas 30 is spaced apart at a first distance of at least about 5 mm, while the second array 41 of mesas 30 is spaced apart at a second distance of less than about 3 mm.

The same temperature profile control can be obtained by changing the dimensions of the contact regions of first array 39 of mesas 30 relative to the dimensions of the contact regions of the second array 41 of mesas 30. For example, the first dimensions of the contact regions of first array 39 of mesas 30 can be less than about 2000 microns, while the contact regions of the second array 41 of mesas 30 can be at least about 3000 microns. The first and second dimensions can be a diameter of a mesa 30 comprising a post shape. In one version, the first dimension is a diameter of 1000 microns and the second dimension is a diameter of 4000 microns. The less the contact area, the higher the temperatures across the substrate processing surface 44. Also, air is provided between the mesas 30 and across the backside surface 28 to serve as a further temperature regulator.

Another factor that affects the ability to rapidly ramp the substrate up and down in temperature is the nature of the thermal interface between the ceramic puck 24 and the base 91. An interface having a good thermal conductivity is desirable at the interface to allow heat to be easily removed from the ceramic puck 24 by the coolant traversing through the base 91. In addition, it is desirable for the interface to be compliant because the high temperature differential between the ceramic puck 24 and the coolant base 91 results in thermal expansion stresses which can cause cracking or other thermal stress induced damage of the ceramic puck 24. In one version, a compliant layer is used to bond the back surface of the ceramic puck 24 to the front surface of the base 91. The compliant layer is fabricated to provide good thermal conductivity while still being sufficient to compliant to absorb the high thermal stresses. In one version, in the compliant layer comprises silicon with embedded aluminum fibers. The silicon material provides good compliance while still having a reasonable thermal conductivity. The thermal conductivity of the silicon material is enhanced with the embedded aluminum fibers. In an another version, the compliant layer comprises acrylic having an embedded wire mesh. Again, the acrylic polymer is selected to provide compliance with thermal stresses while the embedded wire mesh enhances the thermal conductivity of the structure.

The base 91 further comprises an electrical terminal assembly 120 for conducting electrical power to the electrode 36 of the electrostatic chuck 20. The electrical terminal assembly 120 comprises a ceramic insulator jacket 124. The ceramic insulator jacket 124 can be for example, aluminum oxide. A plurality of terminal posts 58 are embedded within the ceramic insulator jacket 124. The terminal posts 58, 58a-d supply electrical power to the electrode 36 and heater coils 50, 52 of the electrostatic chuck 20. For example, the terminal posts 58 can include copper posts.

Figure 6A:
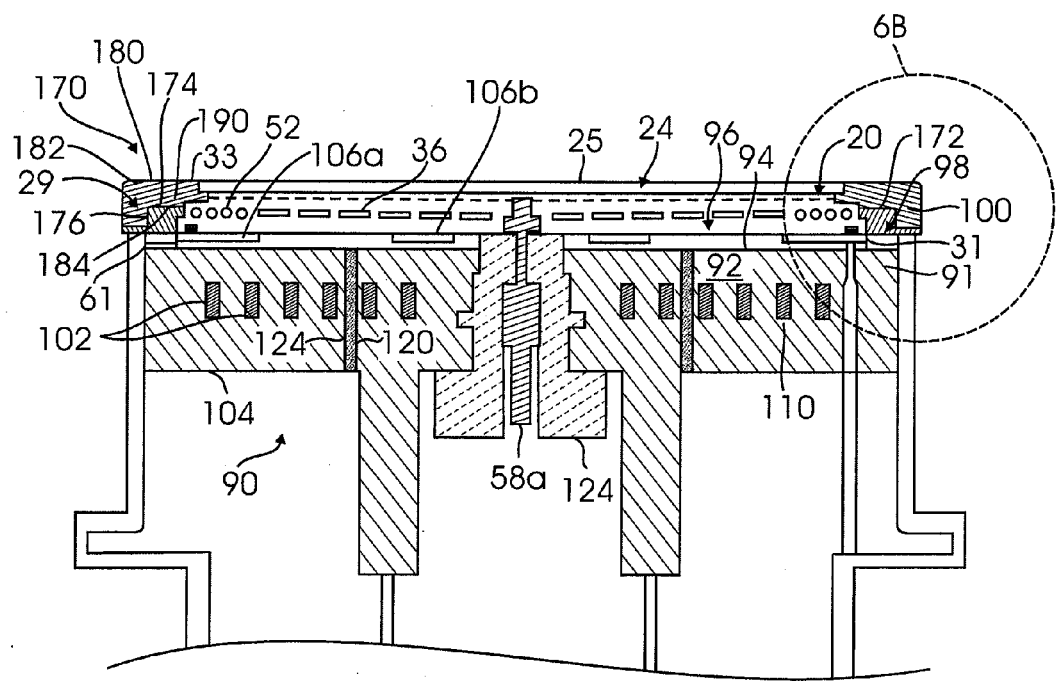
FIG. 6A is a schematic sectional side view of a ring assembly on the electrostatic chuck of FIGS. 4A and 4B.
Figure 6B:
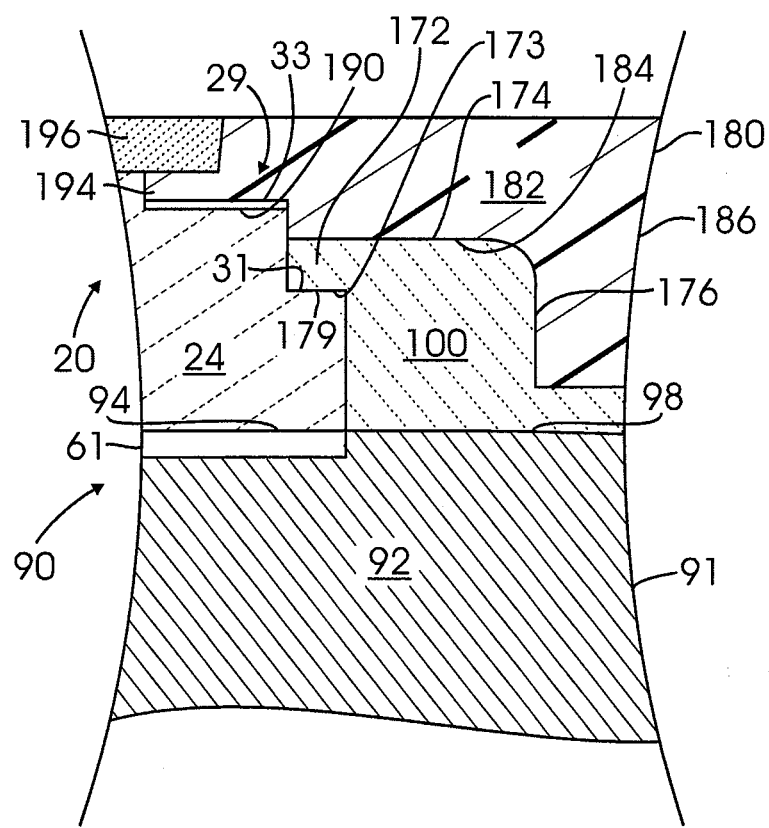
FIG. 6B is a detail of the ring assembly of FIG. 6A.

A ring assembly 170 can also be provide to reduce the formation of process deposits on, and protect from erosion, peripheral regions of the substrate support 90 comprising the electrostatic chuck 20 supported by the base 91, as shown in FIGS. 6A and 6B. The ring assembly 170 comprises a clamp ring 100 that is secured to the peripheral portion 98 of the top surface 94 of the base 91 with securing means such as screws or bolts (not shown). The clamp ring 100 has a lip 172 which extends transversely and radially inward, a top surface 174 and an outer side surface 176. The lip 172 has an undersurface 173 which rests on the first step 31 of the peripheral ledge 29 of the ceramic puck 24 to form a gas-tight seal with the ceramic puck 24, a top surface 174 and an outer side surface 176. In one version, the undersurface 173 comprises a polymer layer 179, for example comprising polyimide, to form a good gas-tight seal. The clamp ring 100 is fabricated from a material that can resist erosion by plasma, for example, a metallic material such as stainless steel, titanium or aluminum; or a ceramic material, such as aluminum oxide.

The ring assembly also includes an edge ring 180 comprising a band 182 having a foot 184 which rests on the top surface 174 of the clamp ring 100. The edge ring also has an annular outer wall 186 enclosing the outer side surface 176 of the clamp ring 100 which would otherwise be exposed to the processing environment to reduce or even entirely preclude deposition of sputtering deposits on the clamp ring 100. The edge ring 180 also comprises a flange 190 covering the second step 33 of the peripheral ledge 29 of the ceramic puck 24 to form a seal with an overlying edge of a substrate retained on the receiving surface of the ceramic puck 24. The flange 190 comprises a projection 194 that terminates below an overhanging edge 196 of the substrate 25. The flange 190 defines an inner perimeter of the ring 180 that surrounds the periphery of the substrate 25 to protect regions of the ceramic puck 24 that are not covered by the substrate 25 during processing. The clamp ring 100 and the edge ring 180 of the ring assembly 170 cooperate to reduce the formation of process deposits on, and protect from erosion, the electrostatic chuck 20 supported on the base 91 during the processing of a substrate 25 in the process chamber 106. The edge ring 180 protects the exposed side surfaces of the substrate support 90 to reduce erosion by the energized plasma species. The ring assembly 170 can be easily removed to clean deposits from the exposed surfaces of the rings 100, 180 so that the entire substrate support 90 does not have to be dismantled to be cleaned. The edge ring 180 comprises a ceramic, such as for example, quartz.

In operation, process gas is introduced into the chamber 106 through a gas delivery system 150 that includes a process gas supply 204 comprising gas sources that each feed a conduit 203 having a gas flow control valve 158, such as a mass flow controller, to pass a set flow rate of the gas therethrough. The conduits feed the gases to a mixing manifold (not shown) in which the gases are mixed to form a desired process gas composition. The mixing manifold feeds a gas distributor (not shown) 162 having gas outlets in the chamber 106. The gas outlets may pass through the chamber sidewalls 128 terminate about a periphery of the substrate support 90 or may pass through the ceiling 130 to terminate above the substrate 25. Spent process gas and byproducts are exhausted from the chamber 106 through an exhaust system 210 which includes one or more exhaust ports 211 that receive spent process gas and pass the spent gas to an exhaust conduit in which there is a throttle valve 178 to control the pressure of the gas in the chamber 106. The exhaust conduit 172 feeds one or more exhaust pumps 218. The exhaust system 210 may also contain an effluent treatment system (not shown) for abating undesirable gases that are exhausted.

The process gas is energized to process the substrate 25 by a gas energizer 208 that couples energy to the process gas in a process zone of the chamber 106 or in a remote zone upstream from the chamber 106 (not shown). By "energized process gas" it is meant that the process gas is activated or energized to form one or more of dissociated gas species, non-dissociated gas species, ionic gas species, and neutral gas species. In one version, the gas energizer 208 comprises an antenna 186 comprising one or more inductor coils 188 which may have a circular symmetry about the center of the chamber 106. Typically, the antenna 186 comprises solenoids having from about 1 to about 20 turns with a central axis coincident with the longitudinal vertical axis that extends through the process chamber 106. A suitable arrangement of solenoids is selected to provide a strong inductive flux linkage and coupling to the process gas. When the antenna 186 is positioned near the ceiling 130 of the chamber 106, the adjacent portion of the ceiling 130 may be made from a dielectric material, such as silicon dioxide, which is transparent to RF or electromagnetic fields. The antenna 186 is powered by an antenna current supply (not shown) and the applied power is tuned by an RF match network 192. The antenna current supply provides, for example, RF power to the antenna 186 at a frequency of typically about 50 KHz to about 60 MHz, and more typically about 13.56 MHz; and at a power level of from about 100 to about 5000 Watts.

When an antenna 186 is used in the chamber 106, the walls 118 include a ceiling 130 made from a induction field permeable material, such as aluminum oxide or silicon dioxide, to allow the inductive energy from the antenna 186 to permeate through the walls 118 or ceiling 130. A suitable semiconductor material is doped silicon. For doped silicon semiconducting ceilings, the temperature of the ceiling 130 is preferably held in a range at which the material provides semiconducting properties and in which the carrier electron concentration is fairly constant with respect to temperature. For doped silicon, the temperature range may be from about 100 K (below which silicon begins to have dielectric properties) to about 600 K (above which silicon begins to have metallic conductor properties).

In one version, the gas energizer 208 is also a pair of electrodes (not shown) that may be capacitively coupled to provide a plasma initiating energy to the process gas or to impart a kinetic energy to energized gas species. Typically, one electrode is in the support 90 below the substrate 25 and the other electrode is a wall, for example, the sidewall 128 or ceiling 130, of the chamber 106. For example, the electrode may be a ceiling 130 made of a semiconductor that is sufficiently electrically conductive to be biased or grounded to form an electric field in the chamber 106 while still providing low impedance to an RF induction field transmitted by the antenna 186 above the ceiling 130. A suitable semiconductor comprises silicon doped to have an electrical resistivity of, for example, less than about 500Ω-cm at room temperature. Generally, the electrodes may be electrically biased relative to one another by an a biasing voltage supply (not shown) that provides an RF bias voltage to the electrodes to capacitively couple the electrodes to one another. The applied RF voltage is tuned by an RF match network 202. The RF bias voltage may have frequencies of about 50 kHz to about 60 MHz, or about 13.56 MHz, and the power level of the RF bias current is typically from about 50 to about 3000 watts.

The chamber 106 may be operated by a controller 300 comprising a computer that sends instructions via a hardware interface to operate the chamber components, including the substrate support 90 to raise and lower the substrate support 90, the gas flow control valves 158, the gas energizer 208, and the throttle valve 178. The process conditions and parameters measured by the different detectors in the chamber 106, or sent as feedback signals by control devices such as the gas flow control valves 158, pressure monitor (not shown), throttle valve 178, and other such devices, are transmitted as electrical signals to the controller 300. Although, the controller 300 is illustrated by way of an exemplary single controller device to simplify the description of present invention, it should be understood that the controller 300 may be a plurality of controller devices that may be connected to one another or a plurality of controller devices that may be connected to different components of the chamber 106; thus, the present invention should not be limited to the illustrative and exemplary embodiments described herein.

The controller 300 comprises electronic hardware including electrical circuitry comprising integrated circuits that is suitable for operating the chamber 106 and its peripheral components. Generally, the controller 300 is adapted to accept data input, run algorithms, produce useful output signals, detect data signals from the detectors and other chamber components, and to monitor or control the process conditions in the chamber 106. For example, the controller 300 may comprise a computer comprising (1) a central processing unit (CPU), such as for example a conventional microprocessor from INTEL corporation, that is coupled to a memory that includes a removable storage medium, such as for example a CD or floppy drive, a non-removable storage medium, such as for example a hard drive, ROM, and RAM; (ii) application specific integrated circuits (ASICs) that are designed and preprogrammed for particular tasks, such as retrieval of data and other information from the chamber 106, or operation of particular chamber components; and (iii) interface boards that are used in specific signal processing tasks, comprising, for example, analog and digital input and output boards, communication interface boards, and motor controller boards. The controller interface boards, may for example, process a signal from a process monitor and provide a data signal to the CPU. The computer also has support circuitry that include for example, co-processors, clock circuits, cache, power supplies and other well known components that are in communication with the CPU. The RAM can be used to store the software implementation of the present invention during process implementation. The instruction sets of code of the present invention are typically stored in storage mediums and are recalled for temporary storage in RAM when being executed by the CPU. The user interface between an operator and the controller 300 can be, for example, via a display and a data input device, such as a keyboard or light pen. To select a particular screen or function, the operator enters the selection using the data input device and can review the selection on the display.

The data signals received and evaluated by the controller 300 may be sent to a factory automation host computer. The factory automation host computer may comprise a host software program that evaluates data from several systems, platforms or chambers 106, and for batches of substrates 25 or over an extended period of time, to identify statistical process control parameters of (i) the processes conducted on the substrates, (ii) a property that may vary in a statistical relationship across a single substrate, or (iii) a property that may vary in a statistical relationship across a batch of substrates. The host software program may also use the data for ongoing in-situ process evaluations or for the control of other process parameters. A suitable host software program comprises a WORKSTREAM™ software program available from aforementioned Applied Materials. The factory automation host computer may be further adapted to provide instruction signals to (i) remove particular substrates 25 from the etching sequence, for example, if a substrate property is inadequate or does not fall within a statistically determined range of values, or if a process parameter deviates from an acceptable range; (ii) end etching in a particular chamber 106, or (iii) adjust process conditions upon a determination of an unsuitable property of the substrate 25 or process parameter. The factory automation host computer may also provide the instruction signal at the beginning or end of etching of the substrate 25 in response to evaluation of the data by the host software program.

In one version, the controller 300 comprises a computer program that is readable by the computer and may be stored in the memory, for example on the non-removable storage medium or on the removable storage medium. The computer program generally comprises process control software comprising program code to operate the chamber 106 and its components, process monitoring software to monitor the processes being performed in the chamber 106, safety systems software, and other control software. The computer program may be written in any conventional programming language, such as for example, assembly language, C++, Pascal, or Fortran. Suitable program code is entered into a single file, or multiple files, using a conventional text editor and stored or embodied in computer-usable medium of the memory. If the entered code text is in a high level language, the code is compiled, and the resultant compiler code is then linked with an object code of pre-compiled library routines. To execute the linked, compiled object code, the user invokes the object code, causing the CPU to read and execute the code to perform the tasks identified in the program.

In operation, using the data input device, for example, a user enters a process set and chamber number into the computer program in response to menus or screens on the display that are generated by a process selector. The computer program includes instruction sets to control the substrate position, gas flow, gas pressure, temperature, RF power levels, and other parameters of a particular process, as well as instructions sets to monitor the chamber process. The process sets are predetermined groups of process parameters necessary to carry out specified processes. The process parameters are process conditions, including without limitations, gas composition, gas flow rates, temperature, pressure, and gas energizer settings such as RF or microwave power levels. The chamber number reflects the identity of a particular chamber when there are a set of interconnected chambers on a platform.

A process sequencer comprises instruction sets to accept a chamber number and set of process parameters from the computer program or the process selector 332 and to control its operation. The process sequencer initiates execution of the process set by passing the particular process parameters to a chamber manager that controls multiple tasks in a chamber 106. The chamber manager may include instruction sets, such as for example, substrate positioning instruction sets, gas flow control instruction sets, gas pressure control instruction sets, temperature control instruction sets, gas energizer control instruction sets, and process monitoring instruction sets. While described as separate instruction sets for performing a set of tasks, each of these instruction sets can be integrated with one another or may be over-lapping; thus, the chamber controller 300 and the computer-readable program described herein should not be limited to the specific version of the functional routines described herein.

The substrate positioning instruction sets comprise code for controlling chamber components that are used to load a substrate 25 onto the substrate support 90, and optionally, to lift a substrate 25 to a desired height in the chamber 106. For example, the substrate positioning instruction sets can include code for operating a transfer robot arm (not shown) which transfers a substrate into the chamber, for controlling lift pins (not shown) which are extended through holes in the electrostatic chuck, and for coordinating the movement of the robot arm with the motion of the lift pins.

The program code also include temperature control instruction sets to set and control temperatures maintained at different regions of the substrate 25, by for example, independently applying different electrical power levels to the first and second heater coils 50, 52 in the ceramic puck 24 of the chuck 20. The temperature control instruction sets also adjust the flow of heat transfer gas passed through the conduits 38a,b.

Figure 7:
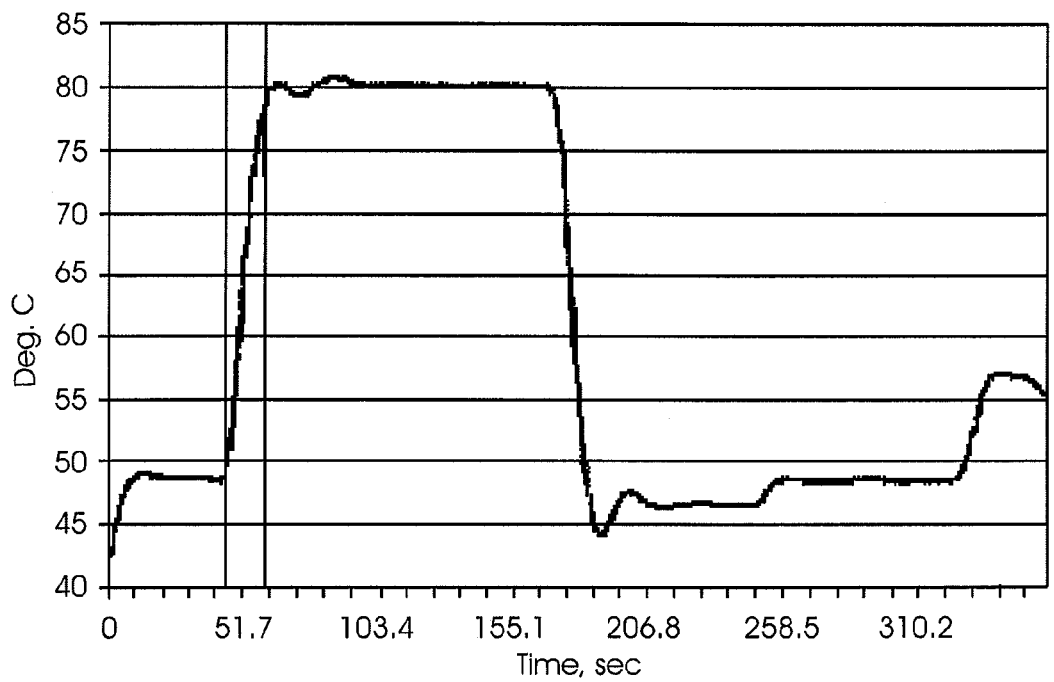
FIG. 7 is a graph depicting substrate temperature ramping over an interval of time with a chiller at a constant temperature.
Figure 9:
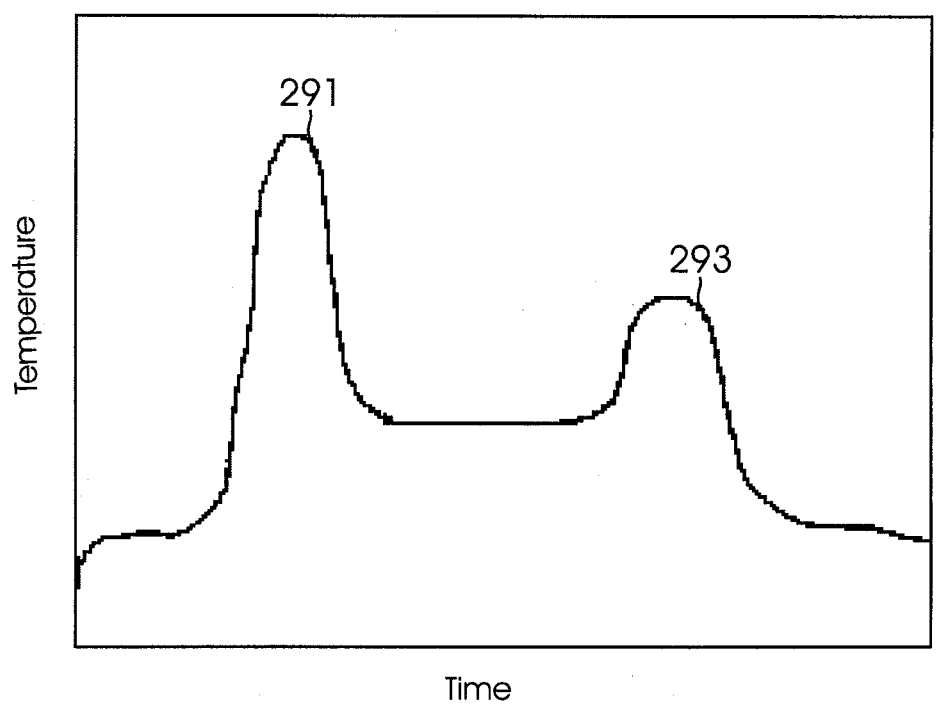
FIG. 9 is a graph depicting the temperature ramping of the electrostatic chuck.

The temperature control instruction sets also comprise code to control the temperature and flow rate of coolant fluid passed through the coolant channels 110 of the base 91. In one version, the temperature control instruction set comprises code to increase a coolant temperature in the chiller to a higher level, for at least about one second, from an earlier a lower level, immediately prior to ramping up the power level applied to the heater. This allows coolant at a higher temperature to be circulated in the coolant channels of the base 91 just before the heater increases temperature to reduce the heat flow from the ceramic puck 24 to the base 91 when the heater does eventually rise in temperature, thereby, effectively increasing the temperature ramp up rate of the substrate. Conversely, the program code includes instruction sets to decrease the coolant temperature, for example, at least by 10° C. and the chiller to a lower level prior to ramping down the power level applied to the heater to accelerate the rate at which heat is transferred from the substrate when the substrate temperature is ramped down. The temperature versus time graph in FIG. 7 depicts the temperature ramp rate for a substrate ramped from 45° C. to 75° C. with the coolant base maintained at 5° C. FIG. 9 depicts the rapid change in substrate temperature through the graph of the temperature ramping of the electrostatic chuck which holds and imparts heat to the substrate. The substrate maintains the same temperature as the electrostatic chuck by the use of backside helium pressure. The graph demonstrates how the electrostatic chuck is ramped up and ramped down over a given interval of time. The two steep hills 291, 293 on the graph indicate the fast ramping up and ramping down of the temperature, respectively. Such fast temperature ramping of the electrostatic chuck allows for rapid changes in the substrate temperature, thus enabling etching of previously incompatible materials such as Poly-Si and WSIX.

A process feedback control instruction sets can serve as a feedback control loop between a temperature monitoring instruction sets which receives temperature signals from the optical temperature sensors 60a,b to adjust the power applied to the chamber components, such as the heater coils 50, 52, the flow of heat transfer gas through the conduits 38a,b, flow of fluid through the channels 110 of the base 91, and chiller coolant temperature.

The gas flow control instruction sets comprise code for controlling the flow rates of different constituents of the process gas. For example, the gas flow control instruction sets may regulate the opening size of the gas flow control valves 158 to obtain the desired gas flow rates from the gas conduits 203 into the chamber 106. In one version, the gas flow control instruction sets comprise code to set a first volumetric flow rate of a first gas and a second volumetric flow rate of a second gas to set a desired volumetric flow ratio of the first process gas to the second process gas in the process gas composition.

The gas pressure control instruction sets comprise program code for controlling the pressure in the chamber 106 by regulating open/close position of the throttle valve 178. The temperature control instruction sets may comprise, for example, code for controlling the temperature of the substrate 25 during etching or code for controlling the temperature of walls of the chamber 106, such as the temperature of the ceiling. The gas energizer control instruction sets comprise code for setting, for example, the RF power level applied to the electrodes or to the antenna 186.

While described as separate instruction sets for performing a set of tasks, it should be understood that each of these instruction sets can be integrated with one another, or the tasks of one set of program code integrated with the tasks of another to perform the desired set of tasks. Thus, the controller 300 and the computer program described herein should not be limited to the specific version of the functional routines described herein; and any other set of routines or merged program code that perform equivalent sets of functions are also in the scope of the present invention. Also, while the controller is illustrated with respect to one version of the chamber 106, it may be used for any chamber described herein.

The present apparatus and process provides significant benefits by allowing very rapid changes in temperature of the substrate between different steps of a process performed on the substrate and the chamber. Such rapid temperature changes increase the speed at which an etching process having multiple steps can be performed. The present system also allows accurate reproduction of a temperature ramp up and ramp down profile desirable for a particular process, such as an etching process having multiple etching stages which are required for the etching of different materials or layers on the substrate. Yet another advantage is that the present apparatus allows maintaining the substrate at temperatures which are significantly higher than the temperature of the coolant base, which in turns allows the application of higher plasma power to the substrate without any substrate temperature drift during the process. The large temperature difference between the substrate and the coolant base also allows good temperature differences between the inner and outer zones of the substrate, thereby compensating for varying annular process conditions across the substrate surface.

Although the present invention has been described in considerable detail with regard to certain preferred versions thereof, other versions are possible. For example, the apparatus components such as the substrate support, coolant base, and temperature sensor can be used for other chambers and for other processes, than those described herein. Therefore, the appended claims should not be limited to the description of the preferred versions contained herein.

What is claimed is:

1. A substrate support assembly comprising:
   (a) a ceramic puck comprising a substrate receiving surface having a plurality of ports to provide a heat transfer gas to the surface, central and peripheral portions, and an opposing backside surface, the ceramic puck comprising (i) an electrode embedded therein to generate an electrostatic force to retain a substrate placed on the substrate receiving surface, and (ii) a heater embedded therein to heat the substrate, the heater comprising a first heater coil located at the peripheral portion of the ceramic puck and a second heater coil located at the central portion of the ceramic puck;
   (b) a coolant base comprising a coolant channel to circulate coolant therethrough, the coolant channel comprising an inlet and terminus;
   (c) a compliant layer bonding the backside surface of the ceramic puck to the coolant base; and
   (d) a controller configured to (i) independently apply different electrical power levels to the first and second heater coils, and control the temperature and flow rate of coolant passed through the coolant channel of the coolant base to increase a coolant temperature of the coolant to a higher level prior to ramping up the power level applied to the first and second heater coils in the ceramic puck, or decrease the coolant temperature of the coolant to a lower level prior to ramping down the power level applied to the first and second heater coils in the ceramic puck, (ii) receive temperature signals from a temperature sensor; and (iii) serve as a feedback control loop to adjust the power applied to the heater coils and the flow of fluid through the coolant channel of the coolant base in response to the temperature signals from the temperature sensor.

2. A support assembly according to claim 1 wherein the inlet and terminus of the coolant channel are adjacent to one another and the coolant channel loops back upon itself.

3. A support assembly according to claim 1 wherein the opposing backside surface of the ceramic puck comprises a plurality of spaced apart mesas, with first mesas adjacent to the inlet of the coolant channel and second mesas that are distal from the inlet of the coolant channel, and comprising at least one of:
   (i) the first mesas are spaced apart a first distance that is larger than a second distance between the second mesas; and
   (ii) the first mesas each have a first contact region having a dimension that is smaller than a dimension of a second contact region of the second mesas.

4. A support assembly according to claim 1 wherein the ceramic puck comprises a thickness of from about 4 mm to about 7 mm.

5. A support assembly according to claim 1 wherein the ceramic puck is composed of aluminum oxide.

6. A support assembly according to claim 5 wherein the electrode and heater each comprise either tungsten or molybdenum.

7. A support assembly according to claim 1 wherein the first and second heater coils are radially spaced apart and concentric about one another.

8. A support assembly according to claim 1 wherein the heater comprises a resistance of about 8.5 ohms.

9. A support assembly according to claim 1 wherein the first heater coil comprises first loops spaced apart a first distance and the second heater coil comprises second loops spaced apart a second distance that is greater than the first distance.

10. A support assembly according to claim 9 wherein the second loops are positioned about a lift pin hole in the ceramic puck.

11. A substrate processing apparatus comprising:
    (a) a process chamber comprising a substrate support mounted therein, the substrate support comprising:
       (i) a ceramic puck comprising a substrate receiving surface having a plurality of ports to provide a heat transfer gas to the receiving surface, and an opposing backside surface, the ceramic puck comprising a thickness of less than 7 mm, and having embedded therein an electrode and a heater, the heater comprising a first heater coil located at a peripheral portion of the ceramic puck and a second heater coil located at a central portion of the ceramic puck;
       (ii) a coolant base below and bonded to the backside surface of the ceramic puck with a compliant layer, the coolant base comprising coolant channels; and
       (iii) a chiller to maintain a coolant at a coolant temperature for passing the coolant through the coolant channels of the coolant base;
    (b) a gas distributor to provide a process gas to the process chamber;
    (c) a gas energizer to energize the process gas;
    (d) a gas exhaust port through which to exhaust the process gas from the chamber; and
    (e) a controller configured to independently apply different electrical power levels to the first and second heater coils, and control the temperature and flow rate of coolant passed through the coolant channels of the coolant base to (i) increase the coolant temperature in the chiller to a higher level prior to ramping up the power level applied to the heater in the ceramic puck, or (ii) decrease the coolant temperature in the chiller to a lower level prior to ramping down the power level applied to the heater in the ceramic puck.

12. An apparatus according to claim 11 wherein the controller is configured to change the coolant temperature in the chiller at least 1 second before ramping up or ramping down the power level applied to the heater in the ceramic puck.

13. An apparatus according to claim 11 wherein the controller is configured to change the coolant temperature by at least about 10° C.

14. An apparatus according to claim 11 wherein the compliant layer bonding the coolant base to the backside surface of the ceramic puck comprises silicon material or acrylic.

15. A support assembly according to claim 1 wherein the compliant layer bonding the backside surface of the ceramic puck to the coolant base comprises silicon material or acrylic.

16. A support assembly according to claim 1 wherein heat transfer gas conduits traverse the ceramic puck to terminate in the ports on the substrate receiving surface, and wherein the conduits comprise a first gas conduit located to supply heat transfer gas to a central heating zone of the substrate receiving surface, and a second gas conduit located to supply heat transfer gas to a peripheral heating zone of the substrate receiving surface.

17. A support assembly according to claim 11 wherein the first and second heater coils comprise a total resistance of less than 10 ohms.

18. A support assembly according to claim 1 comprising optical temperature sensors to measure the temperatures of overlying central and peripheral portions of a substrate.

19. A support assembly according to claim 18 wherein the optical temperature sensors include a first sensor positioned at the central heating zone of the ceramic puck and a second sensor positioned at a peripheral heating zone of the ceramic puck.

\* \* \* \* \*